US008731947B2

(12) United States Patent
Li

(10) Patent No.: US 8,731,947 B2
(45) Date of Patent: May 20, 2014

(54) CODING METHOD, DECODING METHOD, CODEC METHOD, CODEC SYSTEM AND RELEVANT APPARATUSES

(75) Inventor: Haiting Li, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 525 days.

(21) Appl. No.: 12/982,050

(22) Filed: Dec. 30, 2010

(65) Prior Publication Data

US 2011/0093275 A1   Apr. 21, 2011

Related U.S. Application Data

(63) Continuation of application No. PCT/CN2009/074604, filed on Oct. 26, 2009.

(30) Foreign Application Priority Data

Nov. 10, 2008  (CN) .......................... 2008 1 0175265

(51) Int. Cl.
*G10L 19/00* (2013.01)
(52) U.S. Cl.
USPC ........... 704/500; 704/501; 704/504; 704/200; 704/222; 704/229
(58) Field of Classification Search
CPC ... G10L 19/00; G10L 19/0017; G10L 19/002; G10L 19/008; G10L 19/02; G10L 19/167; G10L 21/00
USPC .................. 704/500, 501, 504, 200, 222, 229
See application file for complete search history.

(56) References Cited

U.S. PATENT DOCUMENTS

| 5,263,119 | A | 11/1993 | Tanaka et al. | |
|---|---|---|---|---|
| 6,611,800 | B1 | 8/2003 | Nishiguchi et al. | |
| 6,728,413 | B2 | 4/2004 | Onno | |
| 7,106,228 | B2 * | 9/2006 | Bessette et al. | 341/106 |
| 7,973,679 | B2 * | 7/2011 | Ragot et al. | 341/50 |
| 2001/0010038 | A1 * | 7/2001 | Kang et al. | 704/222 |
| 2010/0228551 | A1 * | 9/2010 | Ragot et al. | 704/500 |

FOREIGN PATENT DOCUMENTS

| CN | 1188957 A | 7/1998 |
|---|---|---|
| CN | 1326159 A | 12/2001 |
| CN | 1540627 A | 10/2004 |
| CN | 101110214 A | 1/2008 |
| CN | 101430881 A | 5/2009 |
| EP | 0831457 A2 | 3/1998 |

(Continued)

OTHER PUBLICATIONS

Xie et al. "Embedded Algebraic Vector Quantizers (EAVQ) With Application to Wideband Speech Coding", IEEE, May 7-10, 1996.*

(Continued)

*Primary Examiner* — Qi Han
(74) *Attorney, Agent, or Firm* — Brinks Gilson & Lione

(57) ABSTRACT

A coding method, a decoding method, a coding-decoding (codec) method, a codec system and relevant apparatuses are disclosed. The coding method includes: obtaining an amplitude vector and a length vector corresponding to a vector to be coded; sorting elements of the amplitude vector and elements of the length vector; and obtaining a position index value according to the sorted amplitude vector and the sorted length vector. A decoding method, a codec system, and relevant apparatuses are also provided.

24 Claims, 6 Drawing Sheets

(56) References Cited

FOREIGN PATENT DOCUMENTS

| EP | 1160690 A1 | 12/2001 |
|---|---|---|
| JP | 2003-345392 A | 12/2003 |
| JP | 2004-120623 | 4/2004 |
| JP | 2004-120623 A | 4/2004 |
| WO | WO 2007/093730 A2 | 8/2007 |

OTHER PUBLICATIONS

Chinese Patent No. 101430881, issued on Apr. 17, 2013, granted in corresponding Chinese Patent Application No. 200810175265.X, 1 page.

Rault, Patrick et al. "Indexing Algorithms for $Z_n$, $A_n$, $D_n$, and $D_n^{++}$ Lattice Vector Quantizers" IEEE Transactions on Multimedia. Dec. 4, 2001:395-404.

Schalwijk, J. Pieter M. "An Algorithm for Source Coding" IEEE Transactions of Information Theory. May 3, 1972: 395-399.

International Search Report issued in corresponding PCT Application No. PCT/CN2009/074604; mailed Feb. 4, 2010.

Extended European Search Report issued in corresponding European Patent Application No. 09824388.4, mailed Jun. 9, 2011.

Written Opinion of the International Searching Authority issued in corresponding PCT Patent Application No. PCT/CN2009/074604, mailed Feb. 4, 2010.

Vasilache et al., "Indexing and Entropy Coding of Lattice Codevectors", IEE International Conference on Acoustics, Speech, and Signal Processing, pp. 2605-2608, May 7, 2011.

* cited by examiner

CODING METHOD, DECODING METHOD, CODEC METHOD, CODEC SYSTEM AND RELEVANT APPARATUSES

CROSS-REFERENCE TO RELATED APPLICATIONS

This application is a continuation of International Application No PCT/CN2009/074604, filed on Oct. 26, 2009, which claims priority to Chinese Patent Application No. 200810175265.X, filed on Nov. 10, 2008, both of which are hereby incorporated by reference in their entireties.

FIELD OF THE DISCLOSURE

The present disclosure relates to data processing, and in particular, to a coding method, a decoding method, a coding-decoding (codec) method, a codec system, and relevant apparatuses.

BACKGROUND

In recent years, with the development of bearer technologies, users impose higher and higher requirements on the coding quality of the audio coder. While pursuing voice conversation, users expect to obtain higher quality and richer media services. On the one hand, in the communications field, users are not satisfied with the quality of the narrowband voice codec at all. Broadband and ultra-broadband voice coders and decoders are phased in. On the other hand, the audio coder applied in the multimedia technical field strives to provide audio coding characterized by low rates and high quality.

Currently, most of the standardized audio coders encode signals by combining the transform coding technology, the psychoacoustic model, and the lattice vector quantization technology.

In the prior art, the latest embedded variable-rate coder put forward by the International Telecommunication Union Telecommunication Standardization Sector (ITU-T) in G.718 uses a lattice codebook index coding method based on hierarchical combination. The coding process includes: encoding a sign of a vector to be coded, and obtaining a modulus vector corresponding to the vector to be coded; and removing corresponding elements in the modulus vector to be coded consecutively according to pre-stored vectors (namely, a vector that represents value of a removed element on each layer and corresponds to each leader vector, and a hierarchical combined coding parameter vector that represents the number of bits required for encoding the sign, the number of layers in the hierarchical coding, and the number of dimensions of the modulus vector on each layer except the top layer); encoding the position of each remaining element on the upper layer; accumulating the coding values on all layers; and obtaining an index value of the final vector to be coded in view of the contribution of the sign coding value of the vector to be coded.

However, the solution above increases the storage complexity. Especially for the lattice vector quantizer characterized by large number of bits to be coded and many leader codewords, the increased storage complexity is almost equivalent to the storage complexity of the codebook itself.

SUMMARY

The embodiments of the present invention provide a coding method, a decoding method, a codec method, a codec system, and relevant apparatuses to simplify storage and improve coding performance.

A coding method according to an embodiment of the present invention includes:
obtaining an amplitude vector and a length vector corresponding to a vector to be coded; sorting elements of the amplitude vector and elements of the length vector; and
obtaining a position index value according to the sorted amplitude vector and the sorted length vector.

A decoding method according to an embodiment of the present invention includes:
receiving a lattice codebook index value sent by a coder;
obtaining an amplitude vector and a length vector;
sorting elements of the amplitude vector and elements of the length vector; and
performing decoding according to the sorted amplitude vector and the sorted length vector to obtain a vector.

A codec method according to an embodiment of the present invention includes:
searching, by a coding apparatus, a preset codebook index value offset table to obtain a codebook index value offset corresponding to a vector to be coded;
obtaining an amplitude vector and a length vector corresponding to the vector to be coded;
sorting elements of the amplitude vector and elements of the length vector;
performing permutation coding for positions of elements in the vector to be coded in best order of element removal according to the sorted amplitude vector and the sorted length vector, and obtaining a position index value;
calculating a lattice codebook index value corresponding to a final vector to be coded according to the codebook index value offset and the position index value, and sending the lattice codebook index value to a decoding apparatus;
searching, by the decoding apparatus, the preset codebook index value offset table to obtain a maximum codebook index value offset less than the received lattice codebook index value;
obtaining element values included in the vector, the amplitude vector, and the length vector according to the found codebook index value offset;
subtracting the codebook index value offset from the lattice codebook index value to obtain a new index value;
sorting the elements of the amplitude vector and the elements of the length vector; and
performing decoding according to the obtained new index value, the sorted amplitude vector, and the sorted length vector to obtain a vector.

A codec system according to an embodiment of the present invention includes:
a coding apparatus, configured to: search a preset codebook index value offset table to obtain a codebook index value offset corresponding to a vector to be coded, obtain an amplitude vector and a length vector corresponding to the vector to be coded, sort elements of the amplitude vector and elements of the length vector, perform permutation coding sequentially for positions of elements in the vector to be coded to obtain a position index value, calculate a lattice codebook index value corresponding to a final vector to be coded according to the codebook index value offset and the position index value, and send the lattice codebook index value to a decoding apparatus; and
a decoding apparatus, configured to: receive the lattice codebook index value sent by the coding apparatus and search the preset codebook index value offset table to obtain a maximum codebook index value offset less than the received lattice codebook index value; obtain element values included in the vector, the amplitude vector, and the length vector according to the found codebook index value offset; subtract the codebook index value offset from the lattice codebook index value to obtain a new index value; sort elements of the amplitude vector and elements of the length vector; and perform decoding according to the obtained new index value, the sorted amplitude vector, and the sorted length vector to obtain a vector.

A codec system according to an embodiment of the present invention includes:

a coding apparatus, configured to: search a preset codebook index value offset table to obtain a codebook index value offset corresponding to a vector to be coded, encode sign vectors in the vector separately to obtain a sign index value, obtain an amplitude vector and a length vector corresponding to a signless vector to be coded, sort elements of the amplitude vector and elements of the length vector, perform permutation coding sequentially for positions of elements in the signless vector to be coded to obtain a position index value, calculate a lattice codebook index value of the vector according to the codebook index value offset, the sign index value, and the position index value, and send the lattice codebook index value to a decoding apparatus; and a decoding apparatus, configured to: receive the lattice codebook index value sent by the coding apparatus and search the preset codebook index value offset table to obtain a maximum codebook index value offset less than the lattice codebook index value; obtain element values included in the vector, the amplitude vector, and the length vector according to the found codebook index value offset; subtract the codebook index value offset from the lattice codebook index value to obtain a new index value; separate a sign index value and a position index value out of the new index value; perform decoding according to the sign index value to obtain a sign vector of nonzero elements; sort the elements of the amplitude vector and the elements of the length vector; perform decoding according to the obtained position index value, the sorted amplitude vector, and the sorted length vector to obtain a signless vector; and calculate out a vector according to the obtained sign vector of nonzero elements and the signless vector.

A coding apparatus according to an embodiment of the present invention includes:

a searching unit, configured to search a preset codebook index value offset table to obtain a codebook index value offset corresponding to a vector to be coded;

an obtaining unit, configured to obtain an amplitude vector and a length vector corresponding to the vector to be coded;

a sorting unit, configured to sort elements of the amplitude vector and elements of the length vector obtained by the obtaining unit;

a permutation coding unit, configured to perform permutation coding for positions of elements in the vector to be coded in best order of element removal according to the amplitude vector and the length vector sorted by the sorting unit, and obtain a position index value; and an executing unit, configured to calculate a lattice codebook index value corresponding to a final vector to be coded according to the codebook index value offset found by the searching unit and the position index value obtained by the permutation coding unit, and send the lattice codebook index value to a decoding apparatus.

A decoding apparatus according to an embodiment of the present invention includes:

a receiving unit, configured to receive a lattice codebook index value sent by a coding apparatus;

a searching unit, configured to search a preset codebook index value offset table to obtain a maximum codebook index value offset less than the received lattice codebook index value, and obtain element values included in a vector, an amplitude vector, and a length vector according to the found codebook index value offset;

a generating unit, configured to subtract the codebook index value offset from the lattice codebook index value to obtain a new index value;

a sorting unit, configured to sort elements of the amplitude vector and elements of the length vector obtained by the searching unit; and a decoding unit, configured to perform decoding according to the new index value obtained by the generating unit as well as the amplitude vector and the length vector sorted by the sorting unit to obtain a vector.

The foregoing technical solution reveals that the embodiments of the present invention bring the following benefits:

In the embodiments of the present invention, the amplitude vector and the length vector corresponding to the vector to be coded are obtained according to the vector to be coded, and permutation coding is performed according to the sorted amplitude vector and the sorted length vector. Because the amplitude vector and the length vector are obtained in real time in the codec process, it is not necessary to store the vector that represents the value of the element removed on each layer and corresponds to each leader vector, or store the vector that represents the hierarchical combination coding parameter, thus simplifying the storage effectively.

In the embodiments of the present invention, regular sequential vectors are obtained after the amplitude vector and the length vector are sorted. Therefore, permutation coding can be performed sequentially for the positions of the elements in the vector to be coded in the best order of removing elements, thus simplifying the calculation in the coding process and improving the coding performance.

DETAILED DESCRIPTION OF THE EMBODIMENTS

In the prior art, the broadband embedded variable-rate coder put forward in G.718 performs index value coding for the sign vector and the modulus vector separately in the vector to be coded; the index value coding for the modulus vector performs coding through a lattice codebook index coding method based on hierarchical combination. In this method, it is necessary to store the vector that represents value of an element removed on each layer and corresponds to each leader vector, and the vector that represents the hierarchical combined coding parameter, thus increasing the storage complexity.

The embodiments of the present invention provide a coding method, a decoding method, a codec method, a codec system, and relevant apparatuses to simplify storage and improve coding performance.

Figure 1:
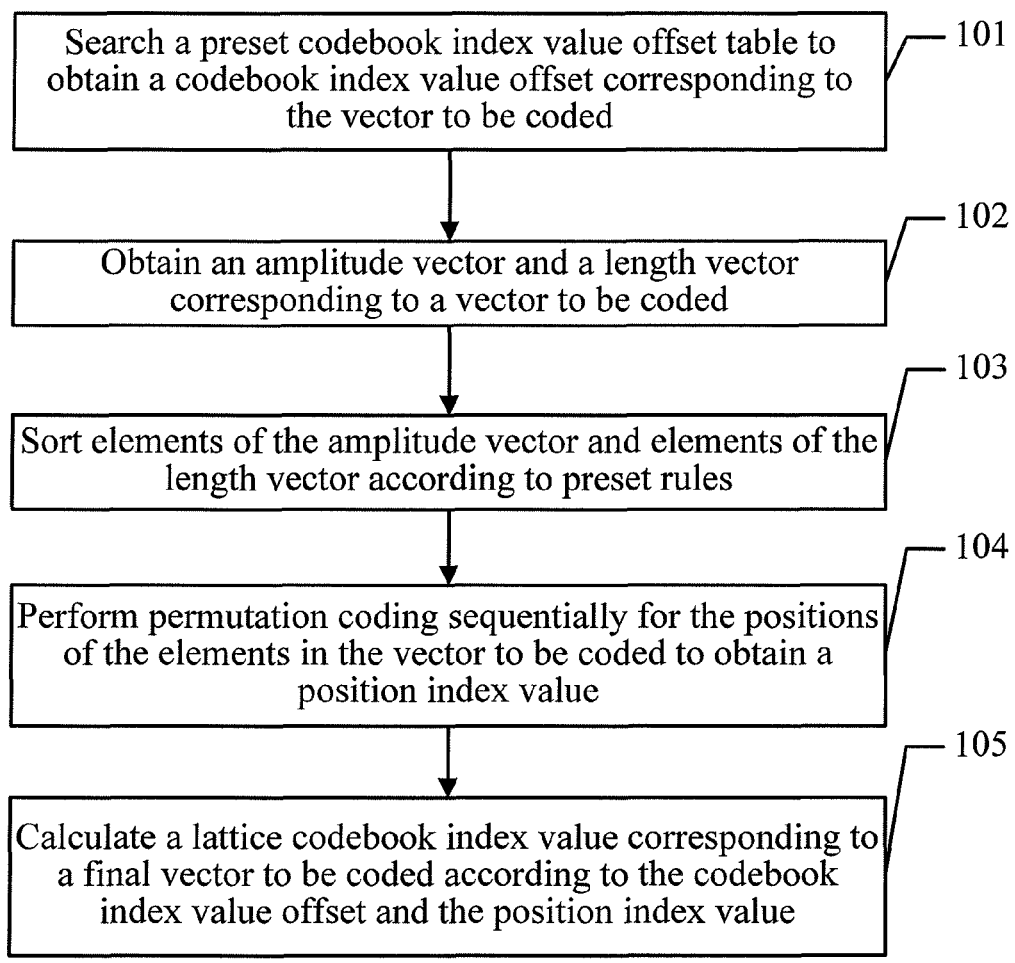
FIG. 1 shows a coding method according to an embodiment of the present invention.

As shown in FIG. 1, a coding method according to an embodiment of the present invention includes the following steps:

101. Search a preset codebook index value offset table to obtain a codebook index value offset corresponding to a vector to be coded.

In this embodiment, a codebook index value offset table is pre-stored on the coder. This table indicates the mapping relation between the vector, the amplitude modulus vector, and the sign vector. This table is similar to the codebook index value offset table in the prior art, and is not limited here.

According to the vector to be coded, the corresponding codebook index value offset can be determined to indicate the amplitude modulus index value and the sign index value.

102. Obtain an amplitude vector and a length vector corresponding to vector to be coded.

In this step, the corresponding amplitude vector and length vector can be obtained or calculated according to the vector to be coded, and specifically, according to the leader vector corresponding to the vector to be coded.

It should be noted that, an amplitude vector corresponding to a vector indicates the elements of different values in the vector; and a length vector corresponding to a vector indicates how many times each element in the amplitude vector appears in the vector.

103. Sort elements of the amplitude vector and elements of the length vector according to preset rules.

In this embodiment, in order to perform permutation coding in the best order of removing elements, the elements of the amplitude vector and the length vector need to be sorted first in this step.

The sorting method may be as follows: rearrange the elements in the amplitude vector regularly according to certain rules, and adjust the order of the elements in the length vector accordingly; rearrange the elements in the length vector regularly according to certain rules, and adjust the order of the elements in the amplitude vector accordingly.

Another sorting method is as follows: rearrange the elements in the length vector regularly according to certain rules, and adjust the order of the elements in the amplitude vector accordingly; if several elements in the length vector are the same after the sorting, readjust the corresponding elements in the amplitude vector regularly according to certain rules.

Besides, the sorting rules come in many types. The elements may be sorted from large values to small values, or from small values to large values.

104. Perform permutation coding sequentially for the positions of the elements in the vector to be coded to obtain a position index value.

Specifically in this embodiment, permutation coding is performed for the positions of the elements in the vector to be coded in the best order of element removal according to the sorted amplitude vector and the sorted length vector, and a position index value is obtained.

The best order of element removal is the order of elements in the amplitude vector, which corresponds to the order of elements arranged from large values to small values in the length vector.

105. Calculate a lattice codebook index value corresponding to a final vector to be coded according to the codebook index value offset and the position index value.

In this embodiment, the amplitude vector and the length vector corresponding to the vector to be coded are obtained according to the vector to be coded, and permutation coding is performed in the best order of element removal according to the sorted amplitude vector and the sorted length vector. Because the amplitude vector and the length vector are obtained in real time in the coding process, it is not necessary to store the vector that represents the value of the element removed on each layer and corresponds to each leader vector, or store the vector that represents the hierarchical combination coding parameter, thus simplifying the storage effectively.

In this embodiment, regular sequential vectors are obtained after the amplitude vector and the length vector are sorted. Therefore, permutation coding can be performed sequentially for the positions of the elements in the vector to be coded in the best order of removing elements, thus simplifying the calculation in the coding process and improving the coding performance.

Figure 2:
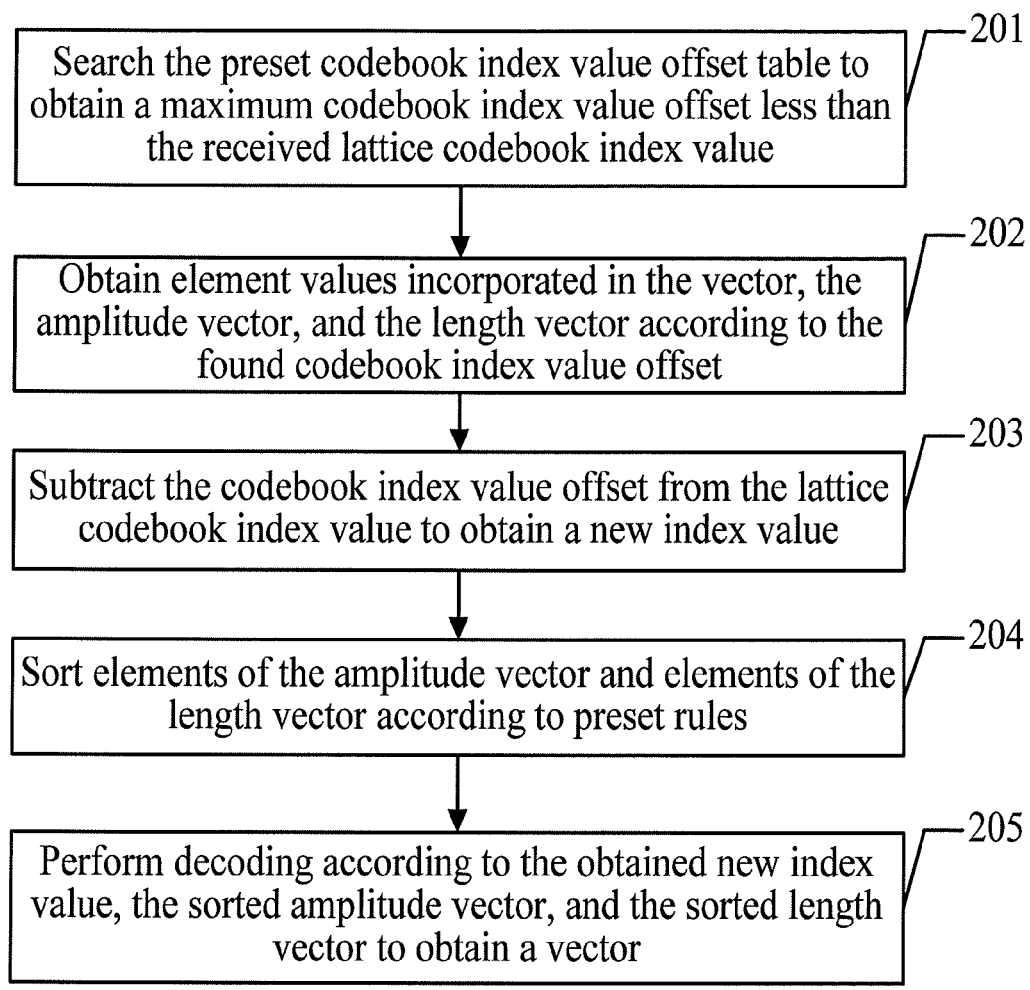
FIG. 2 shows a decoding method according to an embodiment of the present invention.

As the coding process is described above, the following describes the corresponding decoding process under the present invention:

As shown in FIG. 2, a decoding method according to an embodiment of the present invention includes the following steps:

201. Search the preset codebook index value offset table to obtain a maximum codebook index value offset less than the received lattice codebook index value.

In this embodiment, after the decoder receives the lattice codebook index value from the coder, the decoder searches the codebook index value offset table which is the same as the table existent on the coder, and obtains the codebook index value offsets less than the received lattice codebook index value, and then finds the maximum codebook index value offset among the found codebook index value offsets.

202. Obtain element values included in the vector, the amplitude vector, and the length vector according to the found codebook index value offset.

Determine the element values included in the vector according to the tag of the codebook index value offset in the codebook index value offset table, and obtain the corresponding amplitude vector and length vector.

203. Subtract the codebook index value offset from the lattice codebook index value to obtain a new index value.

204. Sort elements of the amplitude vector and elements of the length vector according to preset rules.

In this embodiment, the elements in the amplitude vector and the length vector are sorted according to the rules applied on the coder no matter whether the sorting of the amplitude vector occurs before or after the sorting of the length vector.

205. Perform decoding according to the obtained new index value, the sorted amplitude vector, and the sorted length vector to obtain a vector.

According to the sorted length vector and the sorted amplitude vector, the new index value is decoded in the element removal order applied on the coder, thus obtaining a position vector. A new vector is generated according to the amplitude vector, the length vector and the position vector, and the new vector corresponds to the received lattice codebook index value.

It should be noted that in practice, the coding method above may be combined with the decoding method above, or applied independently.

To make the present invention clearer, the following elaborates the coding method under the present invention through an instance:

The invention is applied to codebook index coding and decoding in a lattice vector quantizer based on Gosset lattice.

The codebook in a lattice vector quantizer based on Gosset lattice is generated out of the most basic root leader vector after the signs and the positions of the elements change. The signs of the elements in each root leader vector change to form a series of leader vectors, and then the positions of the elements in each leader vector change to form the whole codebook. All elements in the root leader vector are non-negative, and are arranged from large values to small values. The lattice vector quantizer based on Gosset lattice stores only the amplitude vector and the length vector corresponding to all root leader vectors. The amplitude vector corresponding to the root leader vector represents different element values in the corresponding vector. Element values are arranged from large values to small values. A length vector corresponding to a root leader vector represents how many times an element value appears in the corresponding vector. Root leader vectors can be easily deduced from the amplitude vector and the length vector corresponding to the root leader vector. Based on the root leader vector and the regularity of change of the element signs, it is easy to calculate out the leader vectors corresponding to each root leader vector, and calculate out the amplitude vector and the length vector corresponding to the leader vectors.

The coder searches the codebook for the vector nearest to the vector to be quantized and obtains the vector to be coded, and obtains the corresponding root leader vector and leader vectors at the same time.

First, the root leader vectors and the leader vectors are introduced below briefly.

In the lattice codebook, if some codewords can be derived from a vector through change of the signs and positions of elements, the vector is called a root leader vector, and such codewords belong to the same root leader. All elements in the root leader vector are non-negative, and are generally arranged from large values to small values. For example, codewords [2 0 0], [0 2 0], [0 0 2], [−2 0 0], [0 −2 0], and [0 0 −2] can be derived from one vector [2 0 0] through change of the signs and positions of elements, and therefore, the vector [2 0 0] is a root leader vector of the six codewords.

In the lattice codebook, if some codewords can be derived from a vector through change of positions of elements, the vector is called a leader vector, and such codewords belong to the same leader. All elements in the leader vector are generally arranged from large values to small values. For example, codewords [2 0 0], [0 2 0], and [0 0 2] can be derived from one vector [2 0 0] through change of the positions of elements, and therefore, the vector [2 0 0] is a leader vector of such three codewords; and, codewords [−2 0 0], [0 −2 0], and [0 0 −2] can be derived from one vector [0 0 −2] through change of the positions of elements, and therefore, the vector [0 0 −2] is a leader vector of such three codewords.

The Following Gives More Details:

Taking an 8-bit quantized 8-dimensional Gosset lattice vector quantizer as an example, this lattice vector quantizer includes two root leader vectors: [2 2 0 0 0 0 0 0] numbered "0", and [1 1 1 1 1 1 1 1] numbered "1". The root leader vector numbered 0 corresponds to the following leader vectors: leader vector [2 2 0 0 0 0 0 0] numbered 0, leader vector [2 0 0 0 0 0 0 −2] numbered 1, and leader vector [0 0 0 0 0 0 −2 −2] numbered 2. The root leader vector numbered 1 corresponds to the following leader vectors: leader vector [1 1 1 1 1 1 1 1] numbered 0, leader vector [1 1 1 1 1 1 −1 −1] numbered 1, leader vector [1 1 1 1 −1 −1 −1 −1] numbered 2, leader vector [1 1 −1 −1 −1 −1 −1 −1] numbered 3, and leader vector [−1 −1 −1 −1 −1 −1 −1 −1] numbered 4.

It is assumed that the vector to be coded is X=[0 0 0 −2 0 2 0 0]. Because the X vector to be coded can be derived from the leader vector [2 0 0 0 0 0 0 −2] through change of the positions of the elements, the leader vector corresponding to the X vector is [2 0 0 0 0 0 0 −2]. Because the X vector to be coded can be derived from the root leader vector [2 2 0 0 0 0 0 0] through change of the signs and positions of the elements, the root leader vector corresponding to the X vector is [2 2 0 0 0 0 0 0].

As shown in FIG. 1, when being applied to the lattice vector quantizer based on Gosset lattice, the coding method includes the following steps:

101. Search a preset codebook index value offset table to obtain a codebook index value offset corresponding to the vector to be coded.

Perform index coding for the amplitude modulus vectors and sign vectors corresponding to the vector to be coded. Here the signs and the amplitude values of the elements in the vector to be coded are coded jointly, and the codebook index value offset table is searched for the codebook index value offset corresponding to vector to be coded.

In this embodiment, the codebook index value offset table may be:

Offset_table[2][5]= {
{0, 28, 84 },
{112, 113, 141, 211, 239}
};

The number of rows of the table corresponds to the number of root leader vectors included in the quantizer, and the number of columns in each row is the number of leader vectors included in the quantizer and covered by the root leader vector. When the codebook index value offset table is searched for the codebook index value offset corresponding to the vector to be coded, the subscript of a row in the table represents the tag of the root leader vector corresponding to the vector to be coded in the codebook (in this embodiment, the X vector belongs to root leader vector numbered 0, and its row subscript is 0). The subscript of a column in the table represents the tag of the leader vector corresponding to the vector to be coded in the root leader vector (in this embodiment, the X vector belongs to leader vector 1 of root leader vector 0, and its column subscript is 1).

The codebook index value offset may be expressed as idxOffset. Specifically, the tag ("1" in this embodiment) of each element sign in the vector to be coded may be obtained according to the sign difference between the root leader vector corresponding to the code to be coded and the vector to be coded. This tag is the tag of the corresponding leader vector, and is the tag of the column subscript.

Because all the elements in the root leader vector are non-negative, the tag that represents each element sign in the vector to be coded is calculated out according to the number of signs of the nonzero elements with the same modulus in the vector to be coded. Afterward, according to the tag ("0" in this embodiment) of the root leader vector corresponding to the vector to be coded in the codebook and the tag ("1" in this embodiment) that represents each element sign in the vector to be coded, the codebook index value offset table is searched for the corresponding codebook index value offset (namely, the codebook index value offset is "28", which is a value in row 0 and column 1 of the table). The codebook index value offset table is calculated and stored beforehand according to the structure of the lattice codebook based on the Gosset lattice. The value in row i and column j of the table is the sum of: the number of all codewords that can be generated by root leader vector numbered 0 to root leader vector numbered i−1, and the number of all codewords that can be generated by leader vector numbered 0 to leader vector numbered j−1 in root leader vector numbered i. In this embodiment, taking the value in row 1 and column 1, 112 codewords are derived from the root leader vector numbered 0 through change of the signs and positions of the elements; 1 codeword is derived from leader vector 0 in root leader vector 1 through change of the positions of the elements, and therefore, the value in row 1 and column 1 is 112+1=113.

102. Obtain amplitude vector and length vector corresponding to the vector to be coded.

In this embodiment, the amplitude vector and the length vector may be obtained according to the leader vector that covers the vector to be coded. For example, if the leader vector that covers the vector to be coded is [2 0 0 0 0 0 0 −2], the amplitude vector is $\mu=[\mu_0\, \mu_1 \ldots \mu_{L_p-1}]=[2\, 0\, -2]$, and the length vector is $W=[w_0\, w_1 \ldots w_{L_p-1}]=[1\, 6\, 1]$, where $L_P$ is equal to 3 and represents the number of dimensions of the amplitude vector and the length vector, namely, the number of elements with different values in the vector to be coded.

The amplitude vector and the length vector may also be obtained according to the vector to be coded. For example, if the vector to be coded is X=[0 0 0 −2 0 2 0 0], the amplitude vector is $\mu=[\mu_0\, \mu_1 \ldots \mu_{L_p-1}]=[0\, -2\, 2]$, and the length vector is $W=[w_0\, w_1 \ldots w_{L_p-1}]=[6\, 1\, 1]$, where $L_P$ is equal to 3 and represents the number of dimensions of the amplitude vector and the length vector, namely, the number of elements with different values in the vector to be coded.

103. Sort elements of the amplitude vector and elements of the length vector according to preset rules.

In this embodiment, the sorting method may be as follows: rearrange the elements in the amplitude vector from large values to small values, and adjust the order of the elements in the length vector accordingly; and then rearrange the elements in the adjusted length vector from large values to small values, and adjust the order of the elements in the amplitude vector accordingly.

If the amplitude vector and the length vector are obtained according to the leader vector of the vector to be coded, the elements of the original amplitude vector are already arranged from large values to small values, and it is necessary only to rearrange the elements of the length vector from large values to small values, and adjust the order of the elements in the amplitude vector accordingly.

If the amplitude vector and the length vector are obtained according to the vector to be coded, the original amplitude vector is $\mu=[\mu_0\, \mu_1 \ldots \mu_{L_p-1}]=[0\, -2\, 2]$, and the length vector is $W=[w_0\, w_1 \ldots w_{L_p-1}]=[6\, 1\, 1]$. First, the elements in the amplitude vector are rearranged from large values to small values to obtain $\mu'=[\mu_0'\, \mu_1' \ldots \mu_{L_p-1}']=[2\, 0\, -2]$, and the order of the elements in the length vector is adjusted accordingly to obtain $W'=[w_0'\, w_1' \ldots w_{L_p-1}']=[1\, 6\, 1]$; and then the elements in the adjusted length vector are rearranged from large values to small values to obtain $W''=[w_0''\, w_1'' \ldots w_{L_p-1}'']=[6\, 1\, 1]$, and the order of the elements in the amplitude vector is adjusted to obtain $\mu''=[\mu_0''\, \mu_1'' \ldots \mu_{L_p-1}'']=[0\, 2\, -2]$. After the sorting, the finally obtained amplitude vector is $\mu'=[\mu_0'\, \mu_1' \ldots \mu_{L_p-1}']=[0\, 2\, -2]$, and the length vector is $W'=[w_0'\, w_1' \ldots w_{L_p-1}']=[6\, 1\, 1]$.

If the amplitude vector and the length vector are obtained according to the leader vector of the vector to be coded, because the elements of the original amplitude vector are already arranged from large values to small values, it is necessary only to rearrange the elements of the length vector from large values to small values. The original length vector obtained according to the leader vector of the vector to be coded is $W=[w_0\, w_1 \ldots w_{L_p-1}]=[1\, 6\, 1]$, the original amplitude vector is $\mu=[\mu_0\, \mu_1 \ldots \mu_{L_p-1}]=[2\, 0\, -2]$, the length vector changes to $W'=[w_0'\, w_1' \ldots w_{L_p-1}']=[6\, 1\, 1]$ after the elements of the length vector are rearranged from large values to small values, and then the order of the elements in the amplitude vector is adjusted accordingly so that the adjusted amplitude vector is $\mu'=[\mu_0'\, \mu_1' \ldots \mu_{L_p-1}']=[0\, 2\, -2]$. After the sorting, the finally obtained amplitude vector is $\mu'=[\mu_0'\, \mu_1' \ldots \mu_{L_p-1}']=[0\, 2\, -2]$, and the length vector is $W'=[w_0'\, w_1' \ldots w_{L_p-1}']=[6\, 1\, 1]$.

Another sorting method is as follows: rearrange the elements in the length vector from large values to small values first, and adjust the order of the elements in the amplitude vector accordingly; if several elements in the length vector are the same after the sorting, readjust the corresponding elements in the amplitude vector from large values to small values.

It is assumed that the amplitude vector and the length vector are obtained according to the vector to be coded. In the coding process (namely, in step 103), the elements in the original length vector are rearranged from large values to small values to obtain $W'=[w_0'\, w_1' \ldots w_{L_p-1}']=[6\, 1\, 1]$, and the order of the elements in the original amplitude vector is adjusted to obtain $\mu'=[\mu_0'\, \mu_1' \ldots \mu_{L_p-1}']=[0\, -2\, 2]$. If several elements in the length vector are the same after the sorting (for example, both the element identified by subscript "1" and the element identified by subscript "2" in the sorted length vector are "1"), it is necessary to readjust the corresponding elements in the amplitude vector from large values to small values, namely, readjust the element identified by subscript "1" and the element identified by subscript "2" in the amplitude vector from large values to small values to obtain $\mu''=[\mu_0''\, \mu_1'' \ldots \mu_{L_p-1}'']=[0\, 2\, -2]$. After the sorting, the finally obtained amplitude vector is $\mu'=[\mu_0'\, \mu_1' \ldots \mu_{L_p-1}']=[0\, 2\, -2]$, and the length vector is $W'=[w_0'\, w_1' \ldots w_{L_p-1}']=[6\, 1\, 1]$.

Therefore, the rearranged amplitude vector is consistent with the length vector no matter whether the amplitude vector and the length vector are obtained according to the leader vector of the vector to be coded or according to the vector to be coded.

Besides, the sorting rule may be that: Both the elements in the amplitude vector and the elements in the length vector are sorted from large values to small values; or, both the elements in the amplitude vector and the elements in the length vector are sorted from small values to large values; or, the elements in the amplitude vector are sorted from large values to small values but the elements in the length vector are sorted from small values to large values; or, the elements in the length vector are sorted from large values to small values but the elements in the amplitude vector are sorted from small values to large values.

For example, the elements in the amplitude vector are rearranged from large values to small values to obtain $\mu'=[\mu_0'\, \mu_1' \ldots \mu_{L_p-1}']=[2\, 0\, -2]$ first, and then the order of the elements in the length vector is adjusted to obtain $W'=[w_0'\, w_1' \ldots w_{L_p-1}']=[1\, 6\, 1]$;

Afterward, the elements in the adjusted length vector are rearranged from small values to large values to obtain $W'''=[w_0'''\, w_1''' \ldots w_{L_p-1}''']=[1\, 1\, 6]$, and then the order of the elements in the amplitude vector is adjusted to obtain $\mu''=[\mu_0''\, \mu_1'' \ldots \mu_{L_p-1}'']=[2\, -2\, 0]$.

104. Perform permutation coding sequentially for the positions of the elements in the vector to be coded to obtain a position index value.

In this embodiment, the order of removing elements is a descending order decided by how many times an element appears in the vector to be coded, namely, the element that appears more frequently in the vector is removed first. Specifically, the order of removing elements may be the order of the elements in the amplitude vector corresponding to the elements arranged from large values to small values in the length vector.

After the storing in this embodiment, the finally obtained length vector is $W'=[w_0' \ w_1' \ \ldots \ w_{L_p-1}']=[6 \ 1 \ 1]$, and the amplitude vector is $\mu'=[\mu_0' \ \mu_1' \ \ldots \ \mu_{L_p-1}']=[0 \ 2 \ -2]$. Because the elements in the length vector are rearranged from large values to small values, the elements in the sorted amplitude vector are removed from the element with a smaller subscript to the element with a larger subscript. In this embodiment, the vector to be coded is divided into $L_p$ layers, and the vector to be coded serves as a top-layer vector. Through an index value coding method based on hierarchical combination, permutation coding is performed for the positions of the elements in the vector to be coded according to the sorted length vector and the sorted amplitude vector. In this way, a position index value is obtained. Specifically, the position index value "idxVecLocal" is obtained in the following way:

(1) Divide the vector to be coded into $L_p$ layers, and use the vector to be coded as a top-layer vector. That is, use layer-0 vector as the vector to be coded. Still taking the foregoing example, layer-0 vector is the vector to be coded, namely, [0 0 0 −2 0 2 0 0].

(2) Increase the n value. On layer n ($0<n<L_p$), the element that appears the most frequently in the upper-layer vector (layer n−1) is removed so that a new vector is obtained. The new vector on the current layer is composed of the remaining elements. The positions of the elements in the new vector depend on the vector on layer n−1. The positions of all remaining elements form a position vector. Still taking the foregoing example, the number of layers is $L_p=3$. On layer 1, an element $\mu_{n-1}'=\mu_0'=0$ is removed from layer-0 vector (original vector), and therefore, the new vector obtained on layer 1 is [−2 2], and the position vector is [3 5]; on layer 2, an element $\mu_{n-1}'=\mu_1'=2$ is removed from layer-1 vector [−2 2], and therefore, the new vector obtained on layer 2 is [−2], and the position vector is [0].

(3) The coding of the position vector of the current-layer vector (layer n) related to the upper-layer vector (layer n−1) is based on a permutation and combination function, and the index value of the position vector is $mid\_idx_n$. For a new vector on the current layer, the index value of the position vector may be deduced from:

$$mid\_idx_n = C_{m_{n-1}}^{m_n} - C_{m_{n-1}-P_0}^{m_n} + \sum_{i=1}^{i<m_n} \left( C_{m_{n-1}-P_{i-1}-1}^{m_n-i} - C_{m_{n-1}-P_i}^{m_n-i} \right)$$

$$idxVecLocal = idxVecLocal * C_{m_{n-1}}^{m_n} + mid\_index_n$$

idxVecLocal=idxVecLocal*$C_{m_{n-1}}^{m_n}$+mid_idx$_n$

The idxVecLocal is initialized to 0 before step (1). In the formulas above, $P_0, P_1, P_2 \ldots$ are the element values included in layer-n position vector, and are all elements from left to right in the position vector according to the layer range; $m_{n-1}$ is the number of dimensions of the upper-layer (layer n−1) vector; $m_n$ is the number of dimensions of the current-layer (layer-n) vector; $C_p^m$ represents a permutation and combination formula $$C_p^m = \frac{p!}{m! \cdot (p-m)!},$$

$p,m=\{1, \ldots, L\}$, $p>m$; and L is the number of dimensions of the vector to be coded. All possible $C_p^m$ values may be stored in a table beforehand to avoid factorial calculation in the program. Layer-n index value idxVecLocal is multiplied by $C_{m_{n-1}}^{m_n}$ which is the total number of possible index values on the current layer to obtain a product, and the product is added to the current-layer index value $mid\_idx_n$ to generate the current-layer index value idxVecLocal.

Still taking the example used in this embodiment, as regards layer 1, the number of dimensions of the upper-layer (layer 0) vector is 8, hence $m_{n-1}=8$; the number of dimensions of the new vector on the current layer (layer 1) is 2, hence $m_n=2$. Therefore, the index value is:

$$mid\_idx_1 = C_{m_{n-1}}^{m_n} - C_{m_{n-1}-P_0}^{m_n} + \sum_{i=1}^{i<m_n} \left( C_{m_{n-1}-P_{i-1}-1}^{m_n-i} - C_{m_{n-1}-P_i}^{m_n-i} \right)$$

$$= C_8^2 - C_{8-P_0}^2 + \sum_{i=1}^{i<2} \left( C_{8-P_{i-1}-1}^{2-i} - C_{8-P_i}^{2-i} \right)$$

$$= C_8^2 - C_{8-P_0}^2 + C_{8-P_0-1}^1 - C_{8-P_1}^1$$

$$= C_8^2 - C_{8-3}^2 + C_{8-3-1}^1 - C_{8-5}^1 = 28 - 10 + 4 - 3 = 19,$$

$$idxVecLocal = idxVecLocal * C_{m_{n-1}}^{m_n} + mid\_index_n = 0 * C_8^2 + 19 = 19.$$

As regards layer 2, the number of dimensions of the upper-layer (layer 1) vector is 2, hence $m_{n-1}=2$; the number of dimensions of the new vector on the current layer (layer 2) is 1, hence $m_n=1$. Therefore, the index value is:

$$mid\_index_2 = C_{m_{n-1}}^{m_n} - C_{m_{n-1}-P_0}^{m_n} + \sum_{i=1}^{i<m_n} \left( C_{m_{n-1}-P_{i-1}-1}^{m_n-i} - C_{m_{n-1}-P_i}^{m_n-i} \right)$$

$$= C_2^1 - C_{2-P_0}^1 = C_2^1 - C_{2-0}^1 = 2 - 2 = 0,$$

$$idxVecLocal =$$
$$idxVecLocal * C_{m_{n-1}}^{m_n} + mid\_index_n = 19 * C_2^1 + 0 = 19 * 2 + 0 = 38.$$

That is, the position index value calculated out in this embodiment is 38.

It should be noted that in step 104 in the foregoing embodiment, the best order of removing elements always obeys this rule: The element which appears more frequently in the vector to be coded is removed first. If the elements in the length vector are rearranged from small values to large values in step 103 above, the elements in the sorted amplitude vector are removed from the element with a larger subscript to the element with a smaller subscript. It is assumed that the elements in the amplitude vector are sorted from large values to small values, and the elements in the length vector are sorted from small values to large values. The sorted length vector is $W'=[w_0' \ w_1' \ldots w_{L_p-1}']=[1 \ 1 \ 6]$, and the sorted amplitude vector is $\mu'=[\mu_0' \ \mu_1' \ldots \mu_{L_p-1}']=[2 \ -2 \ 0]$.

In step (2) under step 104 in this embodiment: On layer n ($0<n<L_p$), the element which appears the most frequently in the upper-layer (layer n−1) vector is removed, and the element changes from to $\mu_{n-1}'$ to $\mu_{L_p-n}'$.

105. Calculate a lattice codebook index value corresponding to a final vector to be coded according to the codebook index value offset and the position index value.

Specifically in this embodiment, the lattice codebook index value corresponding to the final vector to be coded is calculated according to the codebook index value offset and the position index value. More specifically, the lattice codebook index value corresponding to the final vector to be coded is indexVector_NT=idxOffset+idxVecLocal.

From the lattice codebook index value and the position index value calculated out above in this embodiment, it is deduced that indexVector_NT=idxOffset+idxVecLocal=28+38=66.

As the coding method is elaborated above, the following describes the corresponding decoding method under the present invention. As shown in FIG. 2, the decoding method includes the following steps:

201. Search the preset codebook index value offset table to obtain a maximum codebook index value offset less than the received lattice codebook index value.

In this embodiment, the preset codebook index value offset table is searched for all codebook index value offsets less than the lattice codebook index value, and then the maximum codebook index value offset is determined among the codebook index value offsets.

In this embodiment, the lattice codebook index value received by the decoder is 66, and the following codebook index value offset table is searched:

```
Offset_table[2][5]= {
{0, 28, 84},
{112, 113, 141, 211, 239}
};
```

This codebook index value offset table is the same as the codebook index value offset table stored on the coder.

The codebook index value offset table shows 0<28<66<84. Two codebook index value offsets, namely, 0 and 28, are less than 66. The maximum value selected among the two codebook index value offsets is 28.

202. Obtain element values included in the vector, the amplitude vector, and the length vector according to the found codebook index value offset.

As regards the codebook index value offset "28" in the codebook index value offset table, the tag that represents the root leader of the codebook index value offset is 0, and the tag that represents the element sign is 1, indicating leader 1 of root leader 0. According to an inverse process of calculating the tag of the element sign on the coder, because the tag of the element sign is 1, the sign difference between the root leader vector and the leader vector meets the first scenario, namely, the difference between the nonzero elements is 1 sign. From the root leader vector, the corresponding leader vector is deduced as [2 0 0 0 0 0 0 −2]. Therefore, the amplitude vector is $\mu=[\mu_0\,\mu_1\,\ldots\,\mu_{L_p-1}]$[2 0 −2], and the length vector is W=[$w_0$ $w_1\,\ldots\,w_{L_p-1}$][1 6 1].

203. Subtract the codebook index value offset from the lattice codebook index value to obtain a new index value.

The lattice codebook index value is indexVector_NT, the codebook index value offset is idxOffset, and the new index value is idxVecLocal. Therefore, idxVecLocal=indexVector_NT−idxOffset. For example, idxVecLocal=index Vector_NT−idx Offset=66−28=38.

204. Sort elements of the amplitude vector and elements of the length vector according to preset rules.

The sorting rule applied on the decoder may be the same as the sorting rule applied on the coder. That is, the decoder rearranges the elements in the amplitude vector from large values to small values, and adjusts the order of the elements in the length vector accordingly; rearranges the elements in the adjusted length vector from large values to small values, and adjusts the order of the elements in the amplitude vector accordingly.

In this embodiment, the elements of the amplitude vector are arranged from large values to small values, and the elements of the amplitude vector corresponding to the leader vector obtained by the decoder are already arranged in this order. Therefore, it is necessary only to rearrange the elements of the length vector from large values to small values, and adjust the order of the elements in the amplitude vector accordingly. For example, the original amplitude vector is $\mu=[\mu_0\,\mu_1\,\ldots\,\mu_{L_p-1}]$=[2 0 −2], and the length vector is W=[$w_0$ $w_1\,\ldots\,w_{L_p-1}$]=[1 6 1], where $L_p$=3. Therefore, after the element values in the length vector are rearranged from large values to small values, the length vector changes to W'=[$w_0'$ $w_1'\ldots w_{L_p-1}'$]=[6 1 1], and, after the order of the elements in the amplitude vector is adjusted, the amplitude vector is $\mu'$=[$\mu_0'\,\mu_1'\,\ldots\,\mu_{L_p-1}'$]=[0 2 −2].

The decoder may also rearrange the elements in the length vector from large values to small values first, and adjust the order of the elements in the amplitude vector accordingly; if several elements in the length vector are the same after the sorting, the decoder readjusts the corresponding elements in the amplitude vector from large values to small values.

It should be noted that the order of the elements in the amplitude vector and the length vector on the coder side may differ from the order of the elements on the decoder side, but the preset sorting rule applied to the sorting on the coder side needs to be the same as the preset sorting rule applied to the sorting on the decoder side. The coder sorts the amplitude vector before sorting the length vector, and the decoder may sort the amplitude vector before sorting the length vector, or may sort the length vector before sorting the amplitude vector. The coder sorts the length vector before sorting the amplitude vector, and the decoder may sort the amplitude vector before sorting the length vector, or may sort the length vector before sorting the amplitude vector. However, the sorting rule applied to the elements in the length vector on the coder side needs to be the same as the sorting rule applied on the decoder. That is, if the elements in the length vector are sorted from large values to small values on the coder, the elements in the length vector need to be sorted from large values to small values on the decoder too; and if the elements in the length vector are sorted from small values to large values on the coder, the elements in the length vector need to be sorted from small values to large values on the decoder too. Also, the sorting rule applied to the elements in the amplitude vector on the coder side needs to be the same as the sorting rule applied on the decoder. That is, if the elements in the amplitude vector are sorted from large values to small values on the coder, the elements in the amplitude vector need to be sorted from large values to small values on the decoder too; and if the elements in the amplitude vector are sorted from small values to large values on the coder, the elements in the amplitude vector need to be sorted from small values to large values on the decoder too.

205. Perform decoding according to the obtained new index value, the sorted amplitude vector, and the sorted length vector to obtain a vector.

This step may include the following detailed steps:

(1) Obtain an index value mid_idx$_n$: The new index value idxVecLocal is divided into several intermediate index values. The intermediate index values correspond to layers from the lowest layer to the top layer respectively. It is assumed that the new index value idxVecLocal serves as a start value on the corresponding lowest layer. The intermediate index value on each lower layer is a result of dividing the total number ($C_{m_{n-1}}^{m_n}$) of possible index values by the index value, the quotient is an index value on the next lower layer, and the remainder is an intermediate index value mid_idx$_n$ on the current layer.

The number of layers (n) decreases gradually ($L_P$>n>0). mid_idx$_n$=idxVecLocal % $C_{m_{n-1}}^{m_n}$, and idxVecLocal=⌊idxVecLocal/$C_{m_{n-1}}^{m_n}$⌋, where % refers to the operation of taking the remainder, ⌊.⌋ refers to the operation of rounding down, $m_{n-1}$ is the number of dimensions on the upper layer (layer n−1), $m_n$ is the number of dimensions on the current layer (layer n), and $$m_n = \sum_{i=n}^{L_p-1} w_i'.$$

Still taking the example used for description on the coder side above, the index value is idxVecLocal=38. This index value is divided into $L_p$−1=2 intermediate index values:

$$\text{for } n = L_p - 1 = 2, m_2 = \sum_{i=2}^{L_p-1} w_i' = w_2' = 1,$$

$$m_1 = \sum_{i=1}^{L_p-1} w_i' = w_1' + w_2' = 1 + 1 = 2,$$

$$\text{mid\_idx}_2 = idxVecLocal \% \ C_{m_{n-1}}^{m_n} = 38\% \ C_{m_1}^{m_2} = 38\% \ 2 = 0,$$

$$idxVecLocal = \lfloor idxVecLocal / C_{m_1}^{m_2} \rfloor = 19.$$

$$\text{For } n = 1, m_0 = \sum_{i=0}^{L_p-1} w_i' = w_0' + w_1' + w_2' = 6 + 1 + 1 = 8,$$

$$\text{mid\_idx}_1 = idxVecLocal \% \ C_{m_{n-1}}^{m_n} = 19\% \ C_{m_0}^{m_1} = 19\% \ 28 = 19,$$

$$idxVecLocal = \lfloor idxVecLocal / C_{m_0}^{m_1} \rfloor = 0.$$

(2) Decode the position vector: Based on the permutation and combination function, each intermediate index value mid_idx$_n$ on a lower layer is decoded to generate the position vector on each lower layer corresponding to the upper-layer vector. In order to derive the position vector from the intermediate vector on each lower layer, this algorithm uses a permutation and combination function to estimate the position sequence. The estimation steps are as follows:

Step 1: Initialize i=1, and increase the value of pos starting from 0 until the intermediate index value mid_idx$_n$ is not greater than $C_{m_{n-1}}^{m_n} - C_{m_{n-1}-pos}^{m_n}$ any longer.

Step 2: Use $P_0$=pos−1 as the first element value of the position vector, and subtracting $C_{m_{n-1}}^{m_n} - C_{m_{n-1}-P_0}^{m_n}$ from the intermediate index value mid_idx$_n$.

Step 3: Go on increasing the value of pos from $P_{i-1}$+1 until the intermediate index value mid_idx$_n$ is not greater than $C_{m_{n-1}-P_{i-1}-1}^{m_n-i} - C_{m_{n-1}-pos}^{m_n-i}$ any longer, where $P_{i-1}$ is the position value as a result of decoding in the previous step.

Step 4: Use $P_i$=pos−1 as the element value tagged as "i" in the position vector, and subtract $C_{m_{n-1}-P_{i-1}-1}^{m_n-i} - C_{m_{n-1}-P_i}^{m_n-i}$, from the intermediate index value mid_idx$_n$, where i=i+1.

Step 5: Repeat step 3 and step 4 until all position values included in the position sequence on the current layer are decoded out.

Specifically in the foregoing embodiment, for layer n=1, mid_idx$_1$=19, $m_{n-1}$=$m_0$=8, and $m_n$=$m_1$=2, the steps are as follows:

Step 1:
pos=0, $C_{m_{n-1}}^{m_n} - C_{m_{n-1}-pos}^{m_n} = C_8^2 - C_{8-0}^2 = 0 < 19$;
pos=pos+1=1, $C_{m_{n-1}}^{m_n} - C_{m_{n-1}-pos}^{m_n} = C_8^2 - C_{8-1}^2 = 7 < 19$;
pos=pos+1=2, $C_{m_{n-1}}^{m_n} - C_{m_{n-1}-pos}^{m_n} = C_8^2 - C_{8-2}^2 = 13 < 19$;
pos=pos+1=3, $C_{m_{n-1}}^{m_n} - C_{m_{n-1}-pos}^{m_n} = C_8^2 - C_{8-3}^2 = 18 < 19$;
pos=pos+1=4, $C_{m_{n-1}}^{m_n} - C_{m_{n-1}-pos}^{m_n} = C_8^2 - C_{8-4}^2 = 22 > 19$, end.

Step 2:
$P_0$=pos−1=3, mid_idx$_1$=mid_idx$_1$−($C_{m_{n-1}}^{m_n} - C_{m_{n-1}-P_0}^{m_n}$)= 19−($C_8^2 - C_{8-3}^2$)=19−18=1;

Step 3:
pos=$P_0$+1=4, $C_{m_{n-1}-P_{i-1}-1}^{m_n-i} - C_{m_{n-1}-pos}^{m_n-i} = C_{8-3-1}^{2-1} - C_{8-4}^{2-1} = 0 < 1$;
pos=pos+1=5, $C_{m_{n-1}-P_{i-1}-1}^{m_n-i} - C_{m_{n-1}-pos}^{m_n-i} = C_{8-3-1}^{2-1} - C_{8-5}^{2-1} = 1 = $mid_idx$_1$;
pos=pos+1=6, $C_{m_{n-1}-P_{i-1}-1}^{m_n-i} - C_{m_{n-1}-pos}^{m_n-i} = C_{8-3-1}^{2-1} - C_{8-6}^{2-1} = 2 > 1$, end.

Step 4:
$P_1$=pos−1=5. All position values included in the position sequence on the current layer are decoded out.

Likewise, for n=2, mid_idx$_2$=0, and $P_0$=0.

(3) Generate a vector: Start from the lowest layer to the top layer one by one. According to the position parameter, each vector on the lower layer replaces partial elements in the vector on the upper layer. After the decoding, the top-layer vector is the output vector. For the lowest layer, the vector includes only one element value type. This value can be obtained according to the re-sorted amplitude vector. The vector on the lowest layer is transmitted to the lower layer. In the next step, another element value type is added. The new element value is also obtained according to the re-sorted amplitude vector. This process is repeated until the top-layer vector is generated.

According to the Foregoing Instance:
On layer 0, $\mu_0'$=0, and the layer-0 vector is Y=[0 0 0 0 0 0 0 0];
On layer 1, $\mu_1'$=2, P=[3 5], and the layer-1 vector is Y=[0 0 0 2 0 2 0 0];
On layer 2, $\mu_2'$=−2, P=[0], and the layer-2 vector is Y=[0 0 0 −2 0 2 0 0].

Because the total number of layers is 3 and the layer-2 vector is the top-layer vector, Y=[0 0 0 −2 0 2 0 0] is the finally obtained vector.

It should be noted that if the elements in the length vector are rearranged from small values to large values in step 204 above, in step 205:

The formula for calculating $m_n$ (which represents the number of dimensions on the current layer (layer n)) in step (1) and step (2) changes to $$m_n = \sum_{i=0}^{L_p-1-n} w_i'; \text{ and}$$

in step (3), the order of adding new elements from layer 0 to layer $L_P$−1 is not $\mu_n'$, but $\mu_{L_P-1-n}'$.

In the foregoing embodiment, the amplitude vector and the length vector corresponding to the vector to be coded are obtained according to the vector to be coded, and permutation coding is performed in the best order of element removal according to the sorted amplitude vector and the sorted length vector. Because the amplitude vector and the length vector are obtained in real time in the coding process, it is not necessary to store the vector that represents the value of the element removed on each layer and corresponds to each leader vector, or store the vector that represents the hierarchical combination coding parameter, thus simplifying the storage effectively.

In this embodiment, regular sequential vectors are obtained after the amplitude vector and the length vector are sorted. Therefore, permutation coding can be performed sequentially for the positions of the elements in the vector to be coded in the best order of removing elements, thus simplifying the calculation in the coding process and improving the coding performance.

Described above are a codebook index coding process and a codebook index decoding process of a lattice vector quantizer based on Gosset lattice. In practice, the coding and decoding processes under the present invention may also be codebook index coding and decoding processes of a lattice vector quantizer based on RE8 lattice, or codebook index coding and decoding processes of another type of lattice vector quantizer.

Figure 3:
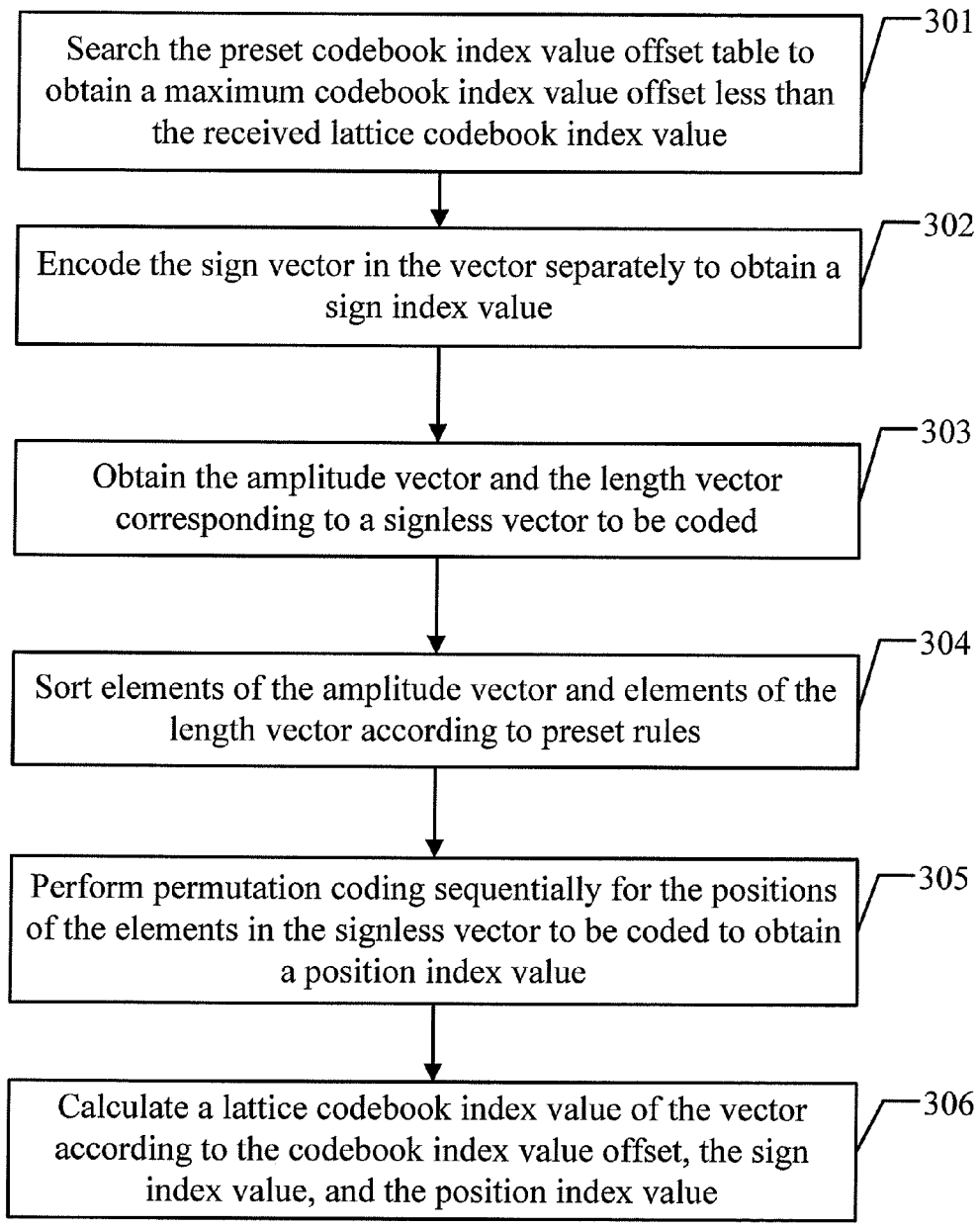
FIG. 3 shows a coding method according to another embodiment of the present invention.

Another coding method is introduced below. As shown in FIG. 3, a coding method according to another embodiment of the present invention includes the following steps:

301. Search a preset codebook index value offset table to obtain a codebook index value offset corresponding to the vector to be coded.

In this embodiment, the coder finds the lattice nearest to the vector to be quantized. This lattice is the vector to be coded.

The coder searches a pre-stored codebook index value offset table to obtain the corresponding codebook index value offset idxOffset according to the root leader vector of the vector to be coded.

302. Encode the sign vector in the vector separately to obtain a sign index value.

In this embodiment, the sign vector is separated from the vector to be coded, and encoded separately to obtain a sign index value idxSign.

The number (N) of bits required for coding is equal to the number of nonzero elements in the vector to be coded. The total number of all possible signs to be coded is $2^N$. For example, if the vector to be coded is X=[0 0 0 −2 0 2 0 0], the sign index is [0 0 0 −1 0 1 0 0]. After the zero elements are removed, the sign vector is [−1 1]. It is assumed that 1 refers to a positive value of the sign and 0 refers to a negative value of the sign (or, in practice, 0 refers to a positive value and 1 refers to a negative value). The code value is a binary number 01, which is converted into 1 as a decimal number. In the vector to be coded, the number of nonzero elements is N=2. Therefore, the total number of all possible signs to be coded is $2^N=4$.

303. Obtain amplitude vector and length vector corresponding to the signless vector to be coded.

304. Sort elements of the amplitude vector and elements of the length vector according to preset rules.

305. Perform permutation coding sequentially for the positions of the elements in the signless vector to be coded to obtain a position index value.

It should be noted that in this embodiment, steps 303-305 in this embodiment are similar to steps 102-104 in the first embodiment of the coding method. The result is: The amplitude vector corresponding to the root leader vector of the vector to be coded is [2 0], the length vector is [2 6], and the signless vector to be coded is [0 0 0 2 0 2 0 0].

306. Calculate a lattice codebook index value of the vector according to the codebook index value offset, the sign index value, and the position index value.

Specifically, the lattice codebook index value indexVector_NT corresponding to the final vector to be coded is calculated according to the obtained sign index value, position index value, and codebook index value offset. The lattice codebook index value corresponding to the final vector to be coded is indexVector_NT=idxOffset+$2^N$*idxVecLocal+idxSign.

Figure 4:
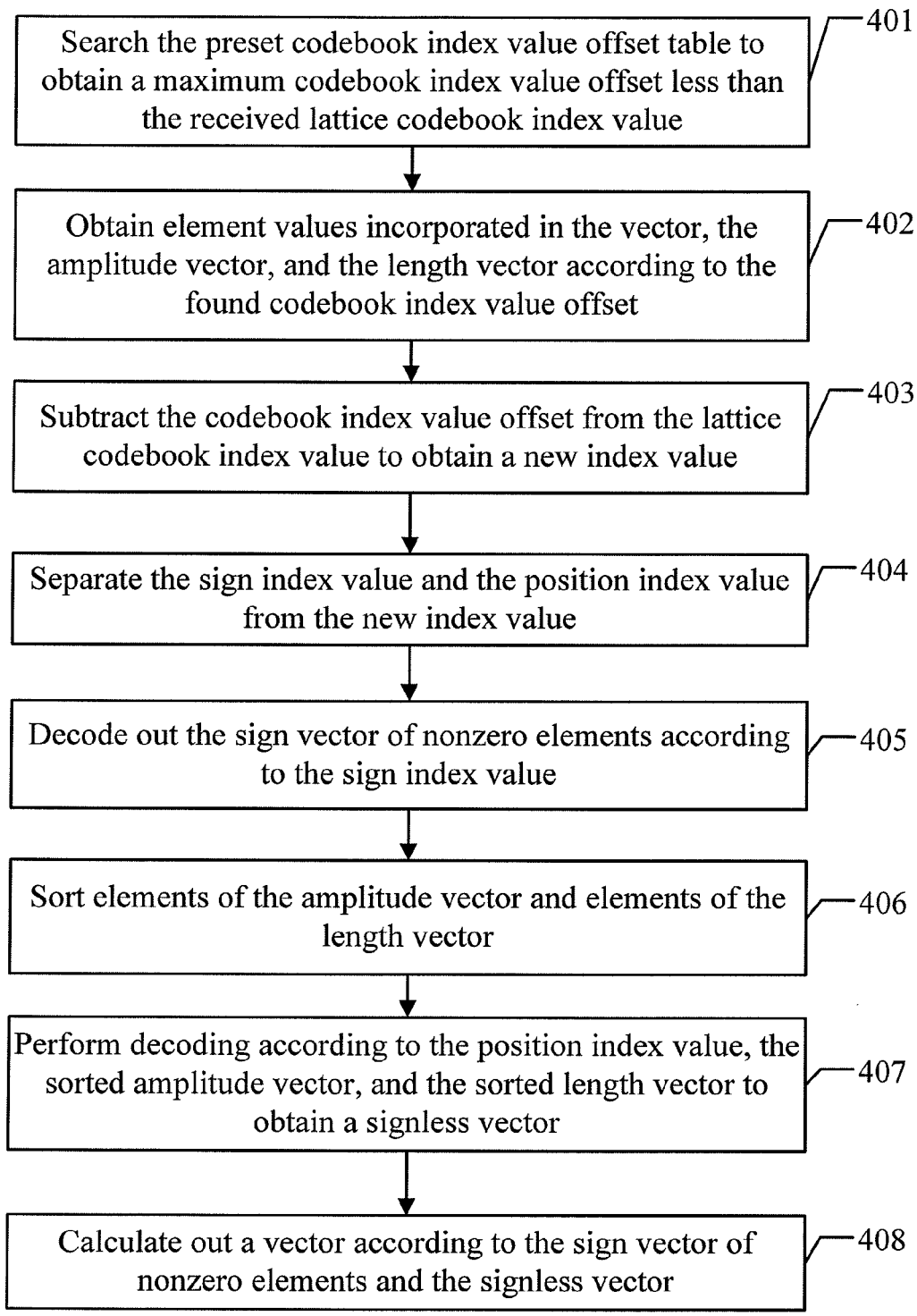
FIG. 4 shows a decoding method according to another embodiment of the present invention.

The following describes the decoding method corresponding to the foregoing coding method:

As shown in FIG. 4, a decoding method according to another embodiment of the present invention includes the following steps:

401. Search the preset codebook index value offset table to obtain a maximum codebook index value offset less than the received lattice codebook index value.

After the decoder receives the lattice codebook index value, the decoder searches the codebook index value offset table to obtain the codebook index value offsets less than the received lattice codebook index value; and then uses the maximum value among the found codebook index value offsets as the codebook index value offset idxOffset.

402. Obtain element values included in the vector, the amplitude vector, and the length vector according to the found codebook index value offset.

The amplitude vector and the length vector are determined according to the tag of the codebook index value offset in the codebook in step 401, where the amplitude vector corresponds to the root leader vector of the vector, the length vector represents how many times each element appears in the vector, and the element values are arranged from large values to small values.

403. Subtract the codebook index value offset from the lattice codebook index value to obtain a new index value.

The codebook index value offset is subtracted from the lattice codebook index value to obtain a new index value. The lattice codebook index value is indexVector_NT, the codebook index value offset is idxOffset, and the new index value is "rank". Therefore, rank=indexVector_NT−idxOffset.

404. Separate the sign index value and the position index value from the new index value.

The sign index value idxSign and the position index value idxVecLocal are separated from the new index value "rank" according to the number (N) of nonzero elements in the root leader vector. Specifically, idxSign=rank % $2^N$, idxVecLocal=$\lfloor$rank/$2^N\rfloor$, where % refers to the operation of taking the remainder, and $\lfloor . \rfloor$ refers to the operation of rounding down.

405. Decode out the sign vector of nonzero elements according to the sign index value.

The sign vector of nonzero elements is decoded out according to the sign index value idxSign. For example, the sign index value is idxSign=1, which is converted into a binary number "01". According to the coding rule which is same as the rule applied on the coder, 1 represents a positive sign, and 0 represents a negative sign. Therefore, the sign vector of the nonzero element is [−1 1].

406. Sort elements of the amplitude vector and elements of the length vector according to preset rules.

407. Perform decoding according to the position index value, the sorted amplitude vector, and the sorted length vector to obtain a signless vector.

Steps 406-407 in this embodiment are similar to steps 204-205 in the first embodiment of the coding method.

408. Calculate out a vector according to the obtained sign vector of nonzero elements and the signless vector.

In this embodiment, the final vector is generated according to the signless vector and the sign vector of nonzero elements. For example, if the signless vector is [0 0 0 2 0 2 0 0] and the sign vector of nonzero elements is [−1 1], the final vector is [0 0 0 −2 0 2 0 0].

It should be noted that in practice, the coding method above may be combined with the decoding method above, or applied independently.

The foregoing embodiments introduce the codebook index coding and decoding processes of a lattice vector quantizer based on Gosset lattice and RE8 lattice. In practice, the coding and decoding processes disclosed here are also applicable to other similar lattice vector quantizers. The type of the lattice vector quantizer is not limited.

In the coding method described above, the amplitude vector and the length vector corresponding to the vector to be coded are obtained according to the vector to be coded, and permutation coding is performed in the best order of element removal according to the sorted amplitude vector and the sorted length vector. Because the amplitude vector and the length vector are obtained in real time in the coding process, it is not necessary to store the vector that represents the value of the element removed on each layer and corresponds to each leader vector, or store the vector that represents the hierarchical combination coding parameter, thus simplifying the storage effectively.

In this embodiment, regular sequential vectors are obtained after the amplitude vector and the length vector are sorted. Therefore, permutation coding can be performed sequentially for the positions of the elements in the vector to be coded in the best order of removing elements, thus simplifying the calculation in the coding process and improving the coding performance.

Secondly, the elements of the amplitude vector and the length vector may be sorted in different modes in the coding process, thus improving flexibility of the coding method.

Figure 5:
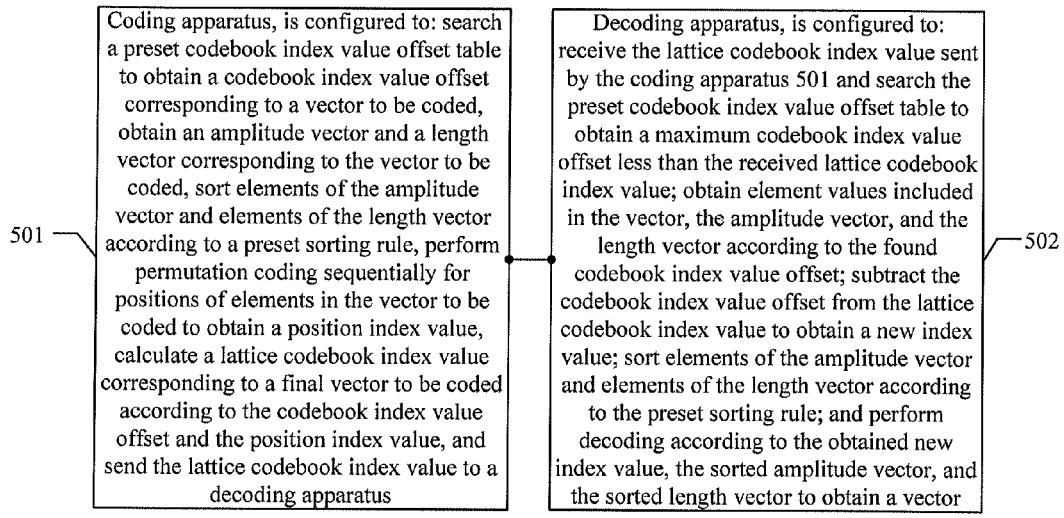
FIG. 5 shows a codec system according to an embodiment of the present invention.

The following describes a codec system according to an embodiment of the present invention. As shown in FIG. 5, the codec system includes: a coding apparatus 501 and a decoding apparatus 502.

The coding apparatus 501 is configured to: search a preset codebook index value offset table to obtain a codebook index value offset corresponding to a vector to be coded, obtain an amplitude vector and a length vector corresponding to the vector to be coded, sort elements of the amplitude vector and elements of the length vector according to a preset sorting rule, perform permutation coding sequentially for positions of elements in the vector to be coded to obtain a position index value, calculate a lattice codebook index value corresponding to a final vector to be coded according to the codebook index value offset and the position index value, and send the lattice codebook index value to a decoding apparatus 502.

The decoding apparatus 502 is configured to: receive the lattice codebook index value sent by the coding apparatus 501 and search the preset codebook index value offset table to obtain a maximum codebook index value offset less than the received lattice codebook index value; obtain element values included in the vector, the amplitude vector, and the length vector according to the found codebook index value offset; subtract the codebook index value offset from the lattice codebook index value to obtain a new index value; sort elements of the amplitude vector and elements of the length vector according to the preset sorting rule; and perform decoding according to the obtained new index value, the sorted amplitude vector, and the sorted length vector to obtain a vector.

The codec system above is applicable to the coding and decoding processes of the lattice vector quantizer based on Gosset lattice, the coding and decoding processes of the lattice vector quantizer based on RE8 lattice, and the coding and decoding processes of other types of the lattice vector quantizer. The following introduces another alternative codec solution. In this solution, the codec system includes:

a coding apparatus 501, configured to: search a preset codebook index value offset table to obtain a codebook index value offset corresponding to a vector to be coded, encode sign vectors in the vector separately to obtain a sign index value, obtain an amplitude vector and a length vector corresponding to a signless vector to be coded, sort elements of the amplitude vector and elements of the length vector according to a preset sorting rule, perform permutation coding sequentially for positions of elements in the signless vector to be coded to obtain a position index value, calculate a lattice codebook index value of the vector according to the codebook index value offset, the sign index value, and the position index value, and send the lattice codebook index value to a decoding apparatus 502; and a decoding apparatus 502, configured to: receive the lattice codebook index value sent by the coding apparatus 501 and search the preset codebook index value offset table to obtain a maximum codebook index value offset less than the lattice codebook index value; obtain element values included in the vector, the amplitude vector, and the length vector according to the found codebook index value offset; subtract the codebook index value offset from the lattice codebook index value to obtain a new index value; separate a sign index value and a position index value out of the new index value; perform decoding according to the sign index value to obtain a sign vector of nonzero elements; sort the elements of the amplitude vector and the elements of the length vector according to the preset sorting rule; perform decoding according to the obtained position index value, the sorted amplitude vector, and the sorted length vector to obtain a signless vector; and calculate out a vector according to the obtained sign vector of nonzero elements and the signless vector.

In the codec system described above, the coding apparatus 501 can obtain the amplitude vector and the length vector corresponding to the vector to be coded according to the vector to be coded, and perform permutation coding in the best order of element removal according to the sorted amplitude vector and the sorted length vector. Because the amplitude vector and the length vector are obtained in real time in the coding process, it is not necessary to store the vector that represents the value of the element removed on each layer and corresponds to each leader vector, or store the vector that represents the hierarchical combination coding parameter, thus simplifying the storage effectively.

Figure 6:
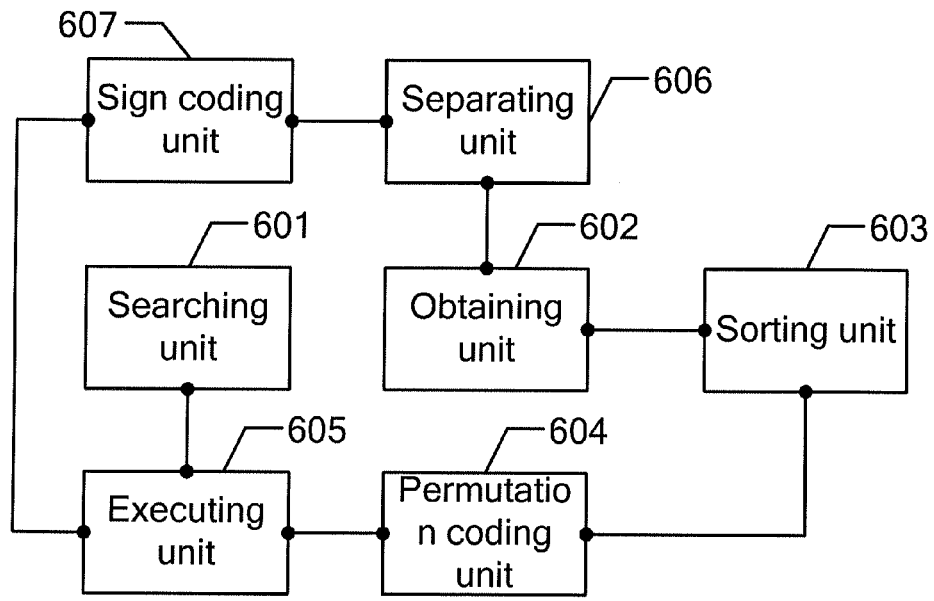
FIG. 6 shows a coding apparatus according to an embodiment of the present invention.

As shown in FIG. 6, a coding apparatus according to an embodiment of the present invention includes:

a searching unit 601, configured to search a preset codebook index value offset table to obtain a codebook index value offset corresponding to a vector to be coded;

an obtaining unit 602, configured to obtain an amplitude vector and a length vector corresponding to the vector to be coded;

a sorting unit 603, configured to sort elements of the amplitude vector and elements of the length vector obtained by the obtaining unit 602 according to a preset sorting rule;

a permutation coding unit 604, configured to perform permutation coding for positions of elements in the vector to be coded in best order of element removal according to the amplitude vector and the length vector sorted by the sorting unit 603, and obtain a position index value; and an executing unit 605, configured to calculate a lattice codebook index value corresponding to a final vector to be coded according to the codebook index value offset found by the searching unit 601 and the position index value obtained by the permutation coding unit 604, and send the lattice codebook index value to a decoding apparatus. The detailed calculation process is the same as the calculation process described in the coding method embodiment above.

The coding apparatus above is applicable to the coding and decoding processes of the lattice vector quantizer based on Gosset lattice, the coding and decoding processes of the lattice vector quantizer based on RE8 lattice, and the coding and decoding processes of other types of the lattice vector quantizer. The following introduces another alternative codec solution. In this solution, the coding apparatus may further include: a separating unit 606 and a sign coding unit 607. Therefore, in this embodiment:

The searching unit 601 is configured to search a preset codebook index value offset table to obtain a codebook index value offset corresponding to a vector to be coded;

the separating unit 606 is configured to separate the sign vector from the vector to be coded;

the sign coding unit 607 is configured to encode the separated sign vector separately to obtain a sign index value;

the obtaining unit 602 is configured to obtain an amplitude vector and a length vector corresponding to the signless vector to be coded;

the sorting unit 603 is configured to sort elements of the amplitude vector and elements of the length vector obtained by the obtaining unit 602 according to a preset sorting rule;

the permutation coding unit 604 is configured to perform permutation coding for positions of elements in the signless vector to be coded in best order of element removal according to the amplitude vector and the length vector sorted by the sorting unit 603, and obtain a position index value; and the executing unit 605 is configured to calculate a lattice codebook index value corresponding to a final vector to be coded according to the codebook index value offset found by the searching unit 601, the position index value obtained by the permutation coding unit 604, and the sign index value obtained by the sign coding unit 607, and send the lattice codebook index value to a decoding apparatus. The detailed calculation process is the same as the calculation process described in the coding method embodiment above.

In the coding apparatus disclosed in this embodiment, the obtaining unit 602 can obtain the amplitude vector and the length vector corresponding to the vector to be coded according to the vector to be coded; the sorting unit 603 sorts the elements of the amplitude vector and the length vector; and the permutation coding unit 604 performs permutation coding in the best order of element removal according to the sorting result of the sorting unit 603 to obtain a position index value. Therefore, the executing unit 605 can calculate the lattice codebook index value corresponding to the final vector to be coded according to the codebook index value offset found by the searching unit 601 and the position index value obtained by the permutation coding unit 604. Because the amplitude vector and the length vector are obtained in real time in the coding process, it is not necessary to store the vector that represents the value of the element removed on each layer and corresponds to each leader vector, or store the vector that represents the hierarchical combination coding parameter, thus simplifying the storage effectively.

Figure 7:
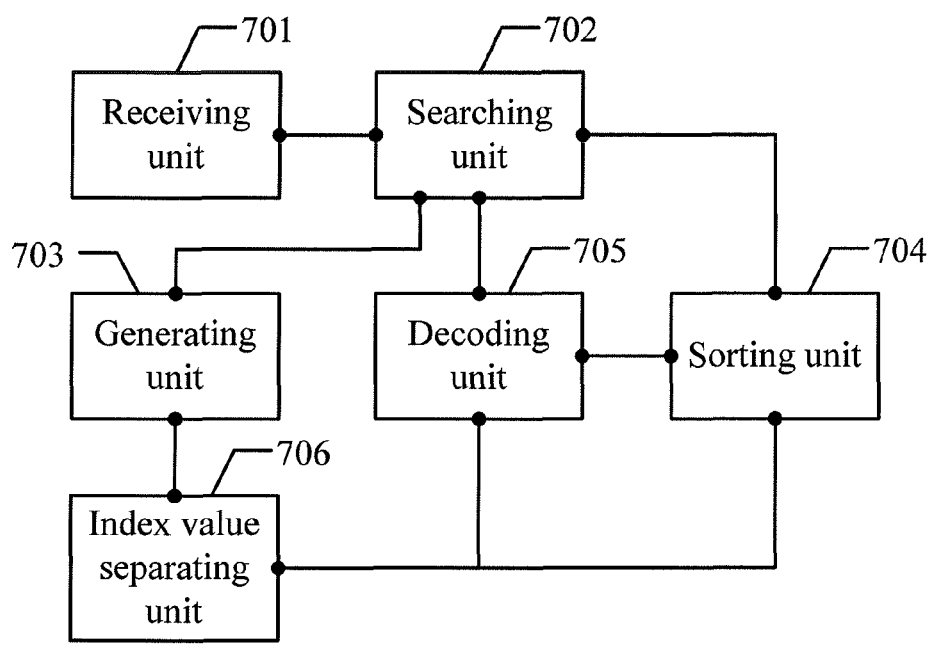
FIG. 7 shows a decoding apparatus according to an embodiment of the present invention.

The following describes a decoding apparatus according to an embodiment of the present invention. As shown in FIG. 7, the decoding apparatus in this embodiment includes:

a receiving unit 701, configured to receive a lattice codebook index value sent by a coding apparatus;

a searching unit 702, configured to search a preset codebook index value offset table to obtain a maximum codebook index value offset less than the received lattice codebook index value, and obtain element values included in a vector, an amplitude vector, and a length vector according to the found codebook index value offset;

a generating unit 703, configured to subtract the codebook index value offset from the lattice codebook index value to obtain a new index value;

a sorting unit 704, configured to sort elements of the amplitude vector and elements of the length vector obtained by the searching unit 702 according to a preset sorting rule; and a decoding unit 705, configured to perform decoding according to the new index value obtained by the generating unit 703 as well as the amplitude vector and the length vector sorted by the sorting unit 704 to obtain a vector. The detailed calculation process is the same as the calculation process described in the decoding method embodiment above.

The decoding apparatus above is applicable to the coding and decoding processes of the lattice vector quantizer based on Gosset lattice, the coding and decoding processes of the lattice vector quantizer based on RE8 lattice, and the coding and decoding processes of other types of the lattice vector quantizer. The following introduces another alternative codec solution. In this solution, the decoding apparatus may further include: an index value separating unit 706. In this embodiment, the decoding apparatus includes:

a receiving unit 701, configured to receive a lattice codebook index value sent by a coding apparatus;

a searching unit 702, configured to search a preset codebook index value offset table to obtain a maximum codebook index value offset less than the received lattice codebook index value, and obtain element values included in a vector, an amplitude vector, and a length vector according to the found codebook index value offset;

a generating unit 703, configured to subtract the codebook index value offset from the lattice codebook index value to obtain a new index value;

an index value separating unit 706, configured to separate the sign index value and the position index value from the new index value generated by the generating unit 703;

a sorting unit 704, configured to sort elements of the amplitude vector and elements of the length vector obtained by the searching unit 702 according to a preset sorting rule; and a decoding unit 705, configured to decode a sorting result of the sorting unit 704 according to the position index value separated by the index value separating unit 706 to obtain a signless vector, perform decoding according to the sign index value separated by the index value separating unit 706 to obtain a sign vector of nonzero elements, and then calculate out a vector according to the obtained sign vector of nonzero elements and the signless vector. The detailed calculation process is the same as the calculation process described in the decoding method above.

Persons of ordinary skill in the art should understand that all or a part of the steps of the method in the embodiments of the present invention may be implemented by a program instructing relevant hardware. The program may be stored in a computer readable storage medium. The storage medium may be a Read-Only Memory (ROM), magnetic disk, or CD-ROM.

Elaborated above are a coding method, a decoding method, a codec method, a codec system, and relevant apparatuses under the present invention. Although the invention is described through some exemplary embodiments, the invention is not limited to such embodiments. It is apparent that those skilled in the art can make modifications and variations to the invention without departing from the spirit and scope of the invention. The invention is intended to cover the modifications and variations provided that they fall in the scope of protection defined by the following claims or their equivalents.

What is claimed is:

1. A coding method performed by a hardware-based encoder apparatus including a non-transitory storage medium, wherein the coding method is applied to codebook index coding in a lattice vector quantizer, the coding method comprising:
    obtaining, by the encoder apparatus, a vector to be coded according to an audio/voice signal;
    obtaining, by the encoder apparatus, an amplitude vector and a length vector corresponding to the vector to be coded, wherein the amplitude vector indicates elements of different values in a leader vector, and the length vector indicates how many times each element in the amplitude vector appears in the leader vector;
    sorting, by the encoder apparatus, elements of the amplitude vector and elements of the length vector;
    obtaining, by the encoder apparatus, a position index value according to the sorted amplitude vector and the sorted length vector;
    searching, by the encoder apparatus, a preset codebook index value offset table to obtain a codebook index value offset corresponding to the vector to be coded;
    obtaining, by the encoder apparatus, a lattice codebook index value corresponding to the vector to be coded according to the codebook index value offset and the position index value;
    writing, by the encoder apparatus, the lattice codebook index value into a bitstream; and
    sending, by the encoder apparatus, the bitstream to a decoder.

2. The method according to claim 1, wherein:
    the sorting of the elements of the amplitude vector and the elements of the length vector comprises: sorting the elements of the amplitude vector and the elements of the length vector according to a preset sorting rule; and
    the preset sorting rule comprises sorting the elements from large values to small values or sorting the elements from small values to large values.

3. The method according to claim 2, wherein the obtaining of the amplitude vector and the length vector corresponding to the vector to be coded comprises:
    finding a leader vector of the vector to be coded; and
    obtaining the corresponding amplitude vector and length vector according to the leader vector, wherein: the amplitude vector indicates elements of different values in the leader vector, and the length vector indicates how many times each element in the amplitude vector appears in the leader vector.

4. The method according to claim 2, wherein: the sorting of the amplitude vector and the length vector according to the preset sorting rule comprises:
    rearranging the elements in the amplitude vector, and adjusting order of the elements in the length vector according to order of the rearranged elements in the amplitude vector; and
    rearranging the elements in the length vector whose element order is adjusted, and adjusting the order of the elements in the amplitude vector according to the order of the rearranged elements in the length vector.

5. The method according to claim 2, wherein: the sorting of the amplitude vector and the length vector according to the preset sorting rule comprises:
    rearranging the elements in the length vector, and adjusting order of the elements in the amplitude vector according to order of the rearranged elements in the length vector; and
    if several elements are the same in the rearranged length vector, adjusting order of the elements in the amplitude vector corresponding to the elements which are the same in the length vector according to the preset rule.

6. The method according to claim 1, wherein: the obtaining of the position index value according to the sorted amplitude vector and the sorted length vector comprises:
    performing permutation coding for positions of elements in the vector to be coded in best order of element removal according to the sorted amplitude vector and the sorted length vector, and obtaining the position index value.

7. The method according to claim 6, further comprising:
    searching a preset codebook index value offset table to obtain a codebook index value offset corresponding to the vector to be coded; and
    obtaining a lattice codebook index value corresponding to the vector to be coded according to the codebook index value offset and the position index value.

8. The method according to claim 6, wherein the obtaining of the amplitude vector and the length vector corresponding to the vector to be coded comprises:
    finding a leader vector of the vector to be coded; and
    obtaining the corresponding amplitude vector and length vector according to the leader vector, wherein: the amplitude vector indicates elements of different values in the leader vector, and the length vector indicates how many times each element in the amplitude vector appears in the leader vector.

9. The method according to claim 6, wherein: the performing of permutation coding for the positions of elements in the vector to be coded in the best order of element removal according to the sorted amplitude vector and the sorted length vector and obtaining of the position index value comprises:
    dividing the vector to be coded into layers, wherein number of the layers is equal to number of dimensions of the amplitude vector;
    using the vector to be coded as a top-layer vector;
    removing the elements in the sorted amplitude vector corresponding to the elements arranged from large values to small values in the sorted length vector to obtain a new vector, and using the new vector as a vector on a layer next to a top layer, wherein the removing starts from the top-layer vector;
    removing the elements on lower layers until all layers are finished; and
    calculating the position index value according to results of the layering and number of dimensions of the new vector on each layer.

10. The method according to claim 1, wherein the obtaining of the amplitude vector and the length vector corresponding to the vector to be coded comprises:
    finding a leader vector of the vector to be coded; and
    obtaining the corresponding amplitude vector and length vector according to the leader vector, wherein: the amplitude vector indicates elements of different values in the leader vector, and the length vector indicates how many times each element in the amplitude vector appears in the leader vector.

11. A decoding method performed by a hardware-based decoder apparatus having a non-transitory storage medium, wherein the decoding method is applied to codebook index decoding in a lattice vector quantizer, the coding method comprising:

receiving, decoder apparatus, a bitstream sent by a coder;
analyzing, decoder apparatus, the bitstream to obtain a lattice codebook index value;
searching, decoder apparatus, a preset codebook index value offset table to obtain a maximum codebook index value offset less than the lattice codebook index value;
obtaining, decoder apparatus, element values incorporated in the vector, the amplitude vector, and the length vector according to the found codebook index value offset, wherein the amplitude vector indicates elements of different values in a leader vector, and the length vector indicates how many times each element in the amplitude vector appears in the leader vector;
subtracting, decoder apparatus, the codebook index value offset from the lattice codebook index value to obtain a new index value;
sorting, decoder apparatus, elements of the amplitude vector and elements of the length vector; and
performing, decoder apparatus, decoding according to the new index value, the sorted amplitude vector and the sorted length vector to obtain a vector, and obtain an audio/voice signal according to the vector.

12. The method according to claim 11, wherein:
after subtracting the codebook index value offset from the lattice codebook index value to obtain the new index value, the method comprises:
separating a sign index value and a position index value from the new index value; and
decoding out a sign vector of nonzero elements according to the sign index value;
the performing of decoding according to the new index value, the sorted amplitude vector, and the sorted length vector to obtain the vector comprises:
performing decoding according to the position index value, the sorted amplitude vector, and the sorted length vector to obtain a signless vector; and
calculating out a vector according to the sign vector of nonzero elements and the signless vector.

13. The method according to claim 11, wherein: the sorting of the elements of the amplitude vector and the length vector comprises:
sorting the elements of the amplitude vector and the elements of the length vector according to a preset sorting rule; wherein the preset sorting rule is to sort the elements from large values to small values or to sort the elements from small values to large values.

14. A hardware-based coding apparatus, wherein the hardware-based coding apparatus performs codebook index coding in a lattice vector quantizer, the hardware-based coding apparatus including a non-transitory storage medium comprising instructions that configure the coding apparatus to comprise:
a unit configured to obtain a vector to be coded according to an audio/voice signal;
a searching unit, configured to search a preset codebook index value offset table to obtain a codebook index value offset corresponding to the vector to be coded;
an obtaining unit, configured to obtain an amplitude vector and a length vector corresponding to the vector to be coded, wherein the amplitude vector indicates elements of different values in a leader vector, and the length vector indicates how many times each element in the amplitude vector appears in the leader vector;
a sorting unit, configured to sort elements of the amplitude vector and elements of the length vector obtained by the obtaining unit;
a permutation coding unit, configured to perform permutation coding for positions of elements in the vector to be coded in best order of element removal according to the amplitude vector and the length vector sorted by the sorting unit, and obtain a position index value; and
an executing unit, configured to calculate a lattice codebook index value corresponding to a final vector to be coded according to the codebook index value offset found by the searching unit and the position index value obtained by the permutation coding unit, write the lattice codebook index value into a bitstream, and send the bitstream to a decoding apparatus.

15. The coding apparatus according to claim 14, further comprising:
a separating unit, configured to separate a sign vector from the vector to be coded; and
a sign coding unit, configured to encode the separated sign vector separately to obtain a sign index value; wherein the obtaining unit is configured to obtain an amplitude vector and a length vector corresponding to a signless vector to be coded;
a permutation coding unit, configured to perform permutation coding sequentially for positions of elements in the signless vector to be coded to obtain a position index value; and
an executing unit, configured to calculate a lattice codebook index value corresponding to a final vector to be coded according to the codebook index value offset, the position index value, and the sign index value.

16. A hardware-based decoding apparatus, wherein the hardware-based decoding apparatus performs codebook index decoding in a lattice vector quantizer, wherein the hardware-based decoding apparatus includes a non-transitory memory comprising instructions that configure the decoding apparatus to comprise:
a receiving unit, configured to receive a bitstream sent by a coding apparatus;
a unit configured to analyze the bitstream to obtain a lattice codebook index value;
a searching unit, configured to search a preset codebook index value offset table to obtain a maximum codebook index value offset less than the received lattice codebook index value, and obtain element values incorporated in a vector, an amplitude vector, and a length vector according to the found codebook index value offset, wherein the amplitude vector indicates elements of different values in a leader vector, and the length vector indicates how many times each element in the amplitude vector appears in the leader vector;
a generating unit, configured to subtract the codebook index value offset from the lattice codebook index value to obtain a new index value;
a sorting unit, configured to sort elements of the amplitude vector and elements of the length vector obtained by the searching unit; and
a decoding unit, configured to perform decoding according to the new index value obtained by the generating unit as well as the amplitude vector and the length vector sorted by the sorting unit to obtain a vector, and obtain an audio/voice signal according to the vector.

17. The decoding apparatus according to claim 16, further comprising:
an index value separating unit, configured to separate a sign index value and a position index value from the new index value generated by the generating unit; wherein the decoding unit is configured to decode a sorting result of the sorting unit according to the position index value to obtain a signless vector, perform decoding according to the sign index value to obtain a sign vector of nonzero elements, and then calculate out a vector according to the obtained sign vector of nonzero elements and the signless vector.

18. A non-transitory computer readable storage medium, embodying computer program code, which, when executed by a computer unit, causes the computer unit to perform a method comprising:

> obtaining an amplitude vector and a length vector corresponding to a vector to be coded, wherein the amplitude vector indicates elements of different values in a leader vector, and the length vector indicates how many times each element in the amplitude vector appears in the leader vector;
> sorting elements of the amplitude vector and elements of the length vector;
> obtaining a position index value according to the sorted amplitude vector and the sorted length vector;
> searching a preset codebook index value offset table to obtain a codebook index value offset corresponding to the vector to be coded; and
> obtaining a lattice codebook index value corresponding to the vector to be coded according to the codebook index value offset and the position index value.

19. The non-transitory computer readable storage medium according to claim 18, wherein:

> the sorting of the elements of the amplitude vector and the elements of the length vector comprises: sorting the elements of the amplitude vector and the elements of the length vector according to a preset sorting rule; and
> the preset sorting rule comprises sorting the elements from large values to small values or sorting the elements from small values to large values.

20. The non-transitory computer readable storage medium according to claim 18, wherein the obtaining of the position index value according to the sorted amplitude vector and the sorted length vector comprises:

> performing permutation coding for positions of elements in the vector to be coded in best order of element removal according to the sorted amplitude vector and the sorted length vector, and obtaining the position index value.

21. The non-transitory computer readable storage medium according to claim 18, wherein the obtaining of the amplitude vector and the length vector corresponding to the vector to be coded comprises:

> finding a leader vector of the vector to be coded; and
> obtaining the corresponding amplitude vector and length vector according to the leader vector, wherein the amplitude vector indicates elements of different values in the leader vector, and the length vector indicates how many times each element in the amplitude vector appears in the leader vector.

22. The non-transitory computer readable storage medium according to claim 20, wherein the performing of permutation coding for the positions of elements in the vector to be coded in the best order of element removal according to the sorted amplitude vector and the sorted length vector and obtaining of the position index value comprises:

> dividing the vector to be coded into layers, wherein number of the layers is equal to number of dimensions of the amplitude vector;
> using the vector to be coded as a top-layer vector;
> removing the elements in the sorted amplitude vector corresponding to the elements arranged from large values to small values in the sorted length vector to obtain a new vector, and using the new vector as a vector on a layer next to a top layer, wherein the removing starts from the top-layer vector;
> removing the elements on lower layers until all layers are finished; and
> calculating the position index value according to results of the layering and number of dimensions of the new vector on each layer.

23. A non-transitory computer readable storage medium, tangibly embodying computer program code, which, when executed by a computer unit, causes the computer unit to perform a method comprising:

> receiving a lattice codebook index value sent by a coder;
> searching a preset codebook index value offset table to obtain a maximum codebook index value offset less than the lattice codebook index value;
> obtaining element values incorporated in the vector, the amplitude vector, and the length vector according to the found codebook index value offset, wherein the amplitude vector indicates elements of different values in a leader vector, and the length vector indicates how many times each element in the amplitude vector appears in the leader vector;
> subtracting the codebook index value offset from the lattice codebook index value to obtain a new index value;
> sorting elements of the amplitude vector and elements of the length vector; and
> performing decoding according to the new index value, the sorted amplitude vector and the sorted length vector to obtain a vector.

24. The non-transitory computer readable storage medium according to claim 23, wherein the sorting of the elements of the amplitude vector and the length vector comprises:

> sorting the elements of the amplitude vector and the elements of the length vector according to a preset sorting rule; wherein the preset sorting rule is to sort the elements from large values to small values or to sort the elements from small values to large values.

* * * * *